United States Patent
Johnson

(10) Patent No.: US 9,159,556 B2
(45) Date of Patent: Oct. 13, 2015

(54) ALLEVIATION OF THE CORROSION PITTING OF CHIP PADS

(71) Applicant: International Business Machines Corporation, Armonk, NY (US)

(72) Inventor: Ward A. Johnson, Colchester, VT (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 25 days.

(21) Appl. No.: 14/021,288

(22) Filed: Sep. 9, 2013

(65) Prior Publication Data

US 2015/0069631 A1    Mar. 12, 2015

(51) Int. Cl.
*H01L 21/02* (2006.01)
*H01L 21/66* (2006.01)

(52) U.S. Cl.
CPC ........... *H01L 21/02697* (2013.01); *H01L 22/14* (2013.01); *H01L 2224/05553* (2013.01); *H01L 2224/45014* (2013.01); *H01L 2224/48472* (2013.01)

(58) Field of Classification Search
CPC ....... H01L 22/32; H01L 22/34; H01L 23/528; H01L 24/11; H01L 24/27; H01L 23/3157; H01L 24/48
See application file for complete search history.

(56) References Cited

U.S. PATENT DOCUMENTS

| | | | |
|---|---|---|---|
| 4,732,858 A | 3/1988 | Brewer et al. | |
| 5,363,994 A | 11/1994 | Angeline | |
| 5,530,278 A * | 6/1996 | Jedicka et al. | 257/432 |
| 5,565,378 A * | 10/1996 | Harada et al. | 438/106 |
| 5,702,767 A | 12/1997 | Peterson et al. | |
| 6,225,224 B1 * | 5/2001 | Pandey et al. | 438/692 |
| 6,261,638 B1 | 7/2001 | van Ooij et al. | |
| 6,455,443 B1 | 9/2002 | Eckert et al. | |
| 6,946,513 B2 | 9/2005 | Higashino et al. | |
| 2003/0032263 A1 * | 2/2003 | Nagao et al. | 438/462 |
| 2005/0147758 A1 * | 7/2005 | Mao et al. | 427/372.2 |

OTHER PUBLICATIONS

Bajat, et al. "Corrosion protection of aluminium pretreated by vinyltriethoxysilane in sodium chloride solution", Corrosion Science, 52(3), pp. 1060-1069 (2010).
Fedel, et al.,"Corrosion protection properties of silane pre-treated powder coated galvanized steel", Progress in Organic Coatings, 66(2), pp. 118-128 (2009).
Lim et al., "Oxidation Prevention and Electrical Property Enhancement of Copper-Filled Isotropically Conductive Adhesives", Journal of ELECTRONIC MATERIALS, vol. 36, No. 10, pp. 1341-1347 (2007).
Zucchi, et al., "Octadecyl-trimethoxy-silane film formed on copper in different conditions", Materials chemistry and physics, 103(2), pp. 340-344 (2007).
Mishra et al., "Effects of curing, washing, and pre-oxidation on the bonding of monofunctional silanes to polished copper surfaces", Journal of adhesion science and technology, 11(3), 337-357 (1997).

* cited by examiner

*Primary Examiner* — David Vu
*Assistant Examiner* — Mouloucoulaye Inoussa
(74) *Attorney, Agent, or Firm* — Thompson Hine LLP; Anthony J. Canale

(57) ABSTRACT

Methods for processing a metal pad of a chip and chip structures including a chip with a metal pad. A surface modification agent is applied to the metal pad on the chip. The surface modification agent is effective to increase the hydrophobicity of the metal pad and may involve silylation.

8 Claims, 3 Drawing Sheets

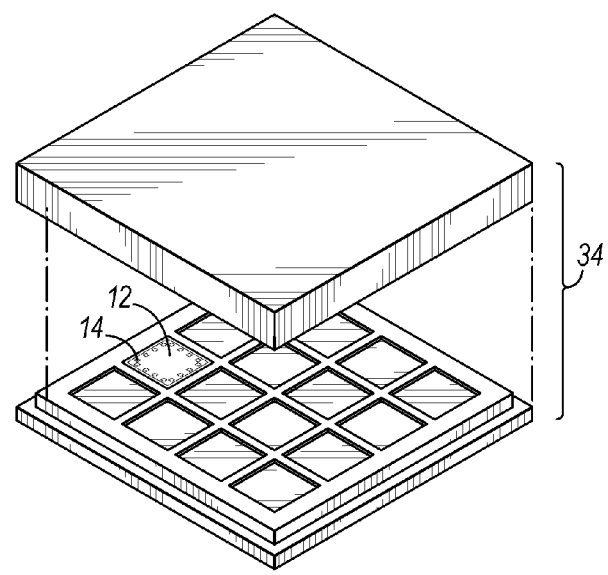
FIG. 5
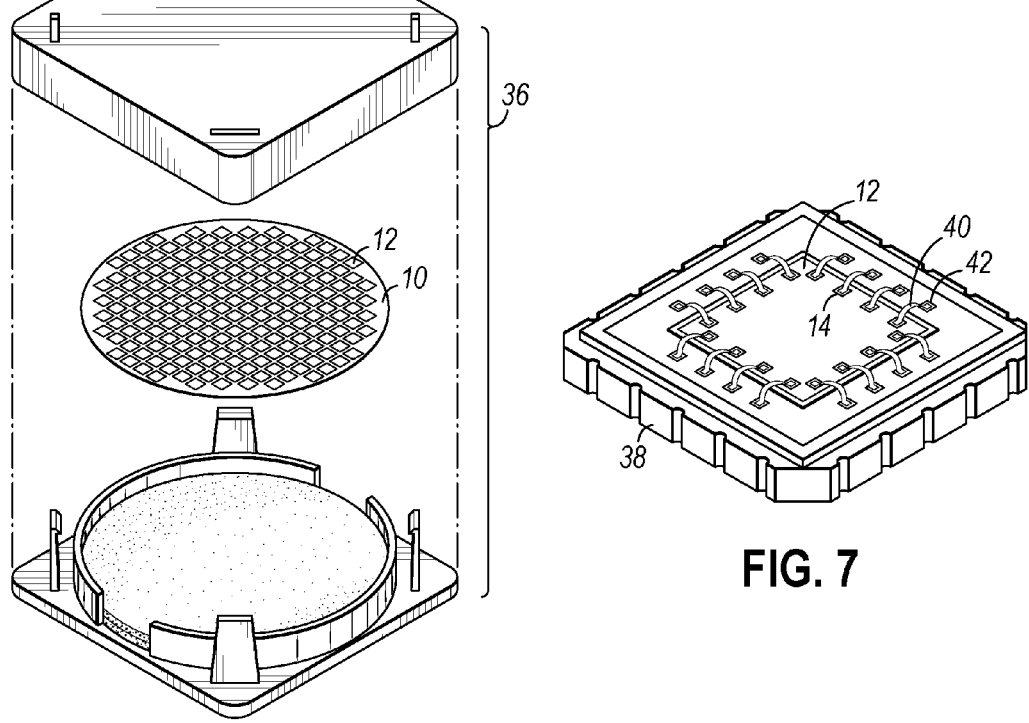
FIG. 6
FIG. 7

ALLEVIATION OF THE CORROSION PITTING OF CHIP PADS

BACKGROUND

The invention relates generally to integrated circuit fabrication and, in particular, to chips with pads and methods for processing the pads of chips.

A chip or die includes integrated circuits formed by front-end-of-line processing of a wafer, a local interconnect layer formed by middle-end-of-line processing, and an interconnect structure comprising a stack of metallization levels formed by back-end-of line processing. Multiple chips can be fabricated on the same wafer. A topmost metallization level includes bond pads that provide electrical access points to the integrated circuits of the chip. During chip packaging, the bond pads on the chip are physically and electrically connected by solder bumps or wire bonds with matching pads on a substrate, such as a printed circuit board. These connections supply electrical pathways for transferring data signals to and from the integrated circuits to an external device, such as a computing system, and electrical pathways for powering the integrated circuits.

The individual integrated circuits of each semiconductor chip on a wafer may be tested to detect functional defects before die preparation and packaging. The bond pads may be used electrical access locations to the integrated circuits of the chip during testing. To avoid damaging the bond pads, the topmost metallization level may include probe pads that also provide electrical access locations to the integrated circuits, but that are not used during bonding.

The testing may be performed by automated test equipment, known as a wafer prober, and involved contact with some form of mechanical probe. Typically, mechanical probes are arranged on a probe card, which is attached to the wafer prober. The wafer may be lifted by the wafer prober until the bond pads or probe pads connected with one or more integrated circuits of a chip on the wafer make physical contact with the mechanical probes.

Improved chips with pads and methods for processing the pads of chips are needed.

SUMMARY

In an embodiment of the invention, a method is provided for processing a chip having a metal pad. The method includes applying a surface modification agent to the metal pad. The surface modification agent is effective to increase hydrophobicity.

In an embodiment of the invention, an apparatus includes a chip having an integrated circuit and a metal pad coupled with the integrated circuit. The surface layer the surface layer has a surface modification effective to increase hydrophobicity.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 5 is an isometric view of the chip of FIG. 1 and a holder in which the chip is placed for delivery to an end user.

FIG. 6 is an isometric view of the wafer of FIG. 1 and a holder in which the wafer is placed for delivery to an end user.

FIG. 7 is an isometric view of the chip of FIG. 1 and a chip carrier to which the chip is mounted.

DETAILED DESCRIPTION

Figure 1:
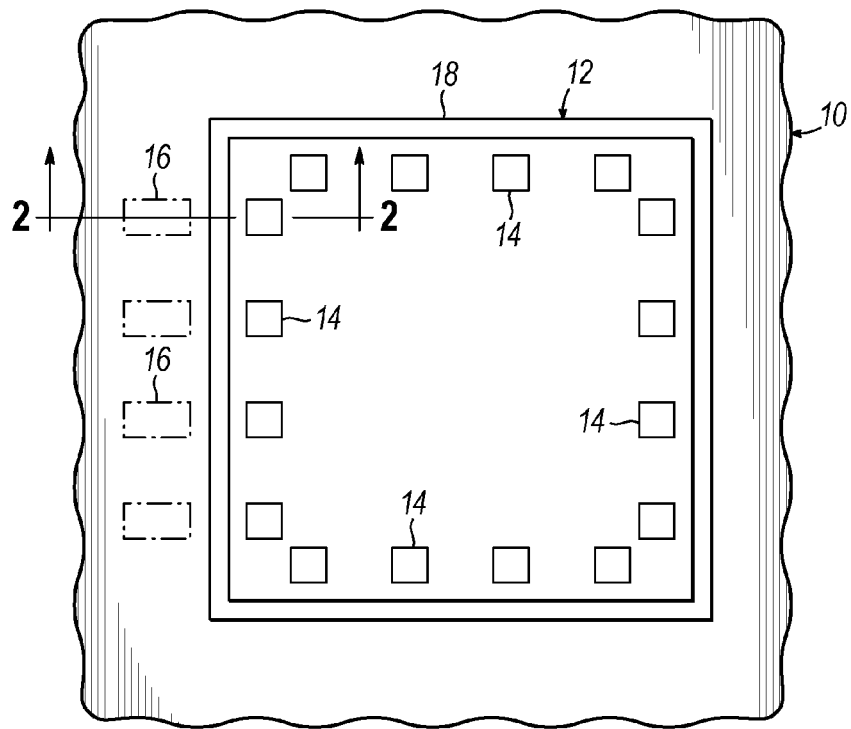
FIG. 1 is a top view of a chip on a portion of a wafer in accordance with an embodiment of the invention.
Figure 2:
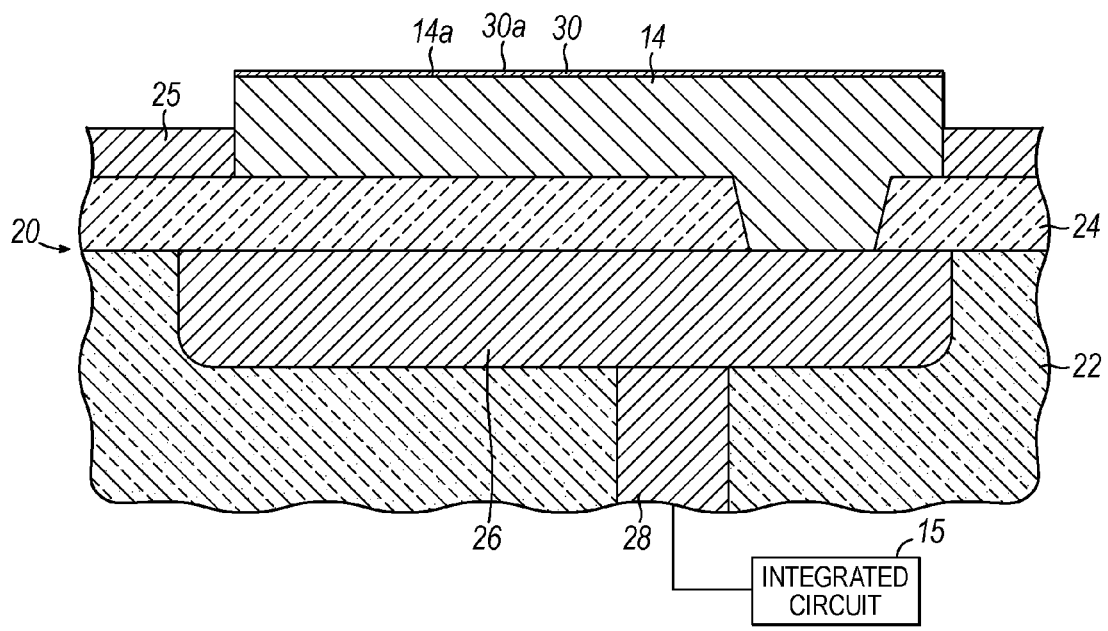
FIG. 2 is a cross-sectional view taken generally along line 2-2 in FIG. 1.

With reference to FIGS. 1, 2 and in accordance with an embodiment of the invention, a wafer, generally indicated by reference numeral 10, has been processed to form a plurality of chips, including the representative chip 12. During a front-end-of-line portion of the process fabricating each chip 12, device structures of integrated circuits are formed using the wafer. Middle-end-of-line and back-end-of-line processing follows to provide wiring coupling the devices of the integrated circuits and coupling the integrated circuits with the external environment. The wafer 10 may be a bulk wafer comprised of silicon, a silicon-on-insulator wafer, or another type of wafer comprised of a semiconductor material utilizable to fabricate one or more integrated circuits. The wafer 10 may be round or disk-shaped and have an outer diameter of 200 mm, 300 mm, 450 mm, etc., as visible in FIG. 5. The chips 12 are manufactured using the available surface area inside the wafer the outer diameter. Prior to singulation, each chip 12 is an integral portion of the wafer 10.

Each chip 12 includes a plurality of metal pads 14 that provide electrical access locations for establishing a pathway with an integrated circuit 15 on the chip 12. Each metal pad 14 may be a probe pad used during testing or a bond pad used during packaging. Alternatively, each metal pad 14 may serve a dual-function pad by integrating these uses and functions. For example, a surface area of each metal pad 14 may be used as a probe pad and a different surface area of each metal pad 14 may be used as a bond pad. In an alternative embodiment, metals pads 16, each similar or identical in structure and/or function to the metal pad 14, may be provided in a kerf region separating an outer boundary 18 of the semiconductor chip 12 from adjacent semiconductor chips and may be dedicated to the testing function.

As best shown in FIG. 2, each metal pad 14 is located in a topmost metallization level 20 of a back-end-of-line interconnect structure. In the vicinity of the metal pad 14, the topmost metallization level 20 includes a plurality of dielectric layers 22, 24, a metal line 26 embedded as metallization in the dielectric layer 22, and a metal via plug 28 embedded as metallization in the dielectric layer 22. The metal pad 14 is coupled through the dielectric layer 24 with the metal line 26. Typical constructions for a BEOL interconnect structure consist of one or more individual metallization levels that are intervening layers between the topmost metallization level 20 and the integrated circuits of the chip 12. The metallization levels of the BEOL interconnect structure are formed by deposition, lithography, etching, and polishing techniques.

A dielectric passivation layer 25 may be formed on a top surface of the dielectric layer 24. The metal pad 14 is positioned inside of an opening formed in the dielectric passivation layer 25 and the material of the dielectric passivation layer 25 at least partially covers the sidewalls of the metal pad 14.

Each of the dielectric layers 22, 24 may be comprised of an organic or inorganic dielectric material that is an electrical insulator with an electrical resistivity at room temperature of greater than $10^{10}$ (Ω–m) is deposited. Candidate inorganic dielectric materials for dielectric layers 22, 24 may include, but are not limited to, silicon dioxide ($SiO_2$), fluorine-doped silicon glass (FSG), and combinations of these dielectric materials. Alternatively, the dielectric layers 22, 24 may be comprised of a low-k dielectric material characterized by a relative permittivity or dielectric constant smaller than the $SiO_2$ dielectric constant of approximately 3.9. Candidate low-k dielectric materials for dielectric layers 22, 24 include, but are not limited to, porous and nonporous spun-on organic low-k dielectrics (e.g., thermoset polymer resins), porous and nonporous inorganic low-k dielectrics (e.g., organosilicate glasses, hydrogen-enriched silicon oxycarbide (SiCOH), and carbon-doped oxides), and combinations of these and other organic and inorganic dielectrics. Dielectric layers 22, 24 may be deposited by any number of techniques including, but not limited to, sputtering, spin-on application, or CVD.

The dielectric passivation layer 25 may be comprised of an organic material, such as a polymer like polyimide, that is optionally photosensitive. In one embodiment, the dielectric passivation layer 25 may be comprised of photosensitive polyimide (PSPI). The dielectric passivation layer 25 may be prepared by dissolving the polymer in a solvent to form a precursor, dehydrate baking the wafer 10, spreading the precursor with a spin coating process as a coating across the wafer 10, and then soft-baking the coating to remove solvents. If the organic material is photosensitive, the dielectric passivation layer 25 may be patterned by exposure through a photomask in a lithography tool, developed using a solvent, and then cured to crosslink and/or imidize the material. If the organic material is not photosensitive, then the material may be cured and then the dielectric passivation layer 25 of cured material may be patterned using an etch mask and a wet chemical etchant.

The metal pad 14 may include multiple layers comprised of one or more conductors, such as copper, aluminum, nickel, or other metals, and is diagrammatically depicted in FIG. 2. In this regard, the metal pad 14 may include a layer stack with a primary conductor layers, adhesion layers, diffusion-barrier layers, etc., and may include structures such as a pedestal that projects above a top surface of the dielectric passivation layer 25 and the like. The metal line 26 and the metal via plug 28 may be comprised of copper, aluminum, an alloy of copper and aluminum, or another type of metal. The metal pad 14 is coupled by the metal line 26 and via plug 28 with underlying metallization in intervening lower metallization levels and, thereby, with the integrated circuits on the chip 12.

As best shown in FIG. 2, the metal pad 14 includes a top surface 14a and a surface layer 30 present on the top surface 14a. The surface layer 30 is positioned between the metal pad 14 and the external surrounding environment of the metal pad 14. The surface layer 30 on the metal pad 14 may comprise a metal oxide that forms as a result of environmental exposure (for example, a native oxide) or that is formed by a process, such as by a wet or dry thermal oxidation process or by deposition. The surface layer 30 may have a thickness greater than or equal to a monolayer. If the metal pad 14 is comprised of aluminum, then the surface layer 30 may be comprised of aluminum oxide that is hydrated at least proximate to top surface 30a. The surface layer 30 may also be present on any portion of the sidewalls of the metal pad 14 that are not covered by the dielectric passivation layer 25.

Figure 3A:
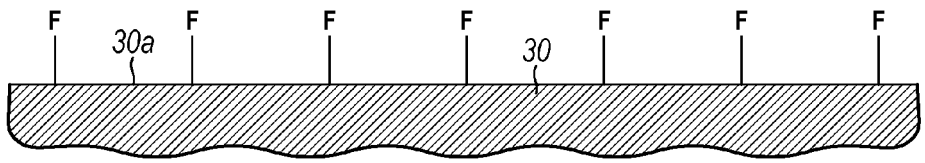
FIG. 3A is an enlarged diagrammatic view of the top surface of the surface layer on one of the metal pads of the chip before application of the surface modification agent.
Figure 3B:
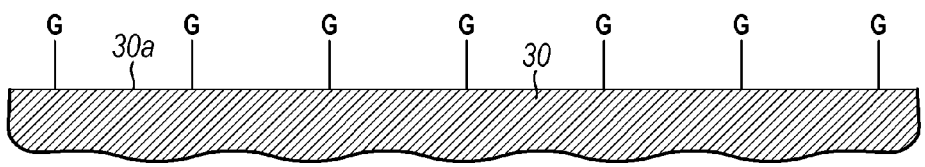
FIG. 3B is an enlarged diagrammatic view similar to FIG. 3A after application of the surface modification agent.

With reference to FIGS. 3A, 3B in which like reference numerals refer to like features in FIGS. 1, 2, a surface modification agent may be applied in a contacting relationship with the top surface 30a of the surface layer 30 on the metal pad 14. Before surface modification and as shown in FIG. 3A, the material at the top surface 30a of the surface layer 30 may include functional groups, F. The functional groups, F, may be hydroxyl groups (OH) and may present a polar surface. As shown in FIG. 3B, each functional group, F, at the top surface 30a may be displaced upon contact with the surface modification agent and replaced by a different functional group, G, to form the modified material at the top surface 30a of the surface layer 30. Each functional group, G, binds at the binding sites formerly occupied by one of the functional groups, F, and provides a non-polar surface.

The top surface 30a may be dehydrated by the displacement of functional groups and the binding of a different functional group at the former binding site of each displaced functional group. The displacement eliminates or, at the least, reduces the availability of functional groups, F, at the top surface 30a. The modified top surface 30a of the surface layer 30 may exhibit a reduced surface energy, which increases its hydrophobicity. Water applied on the modified top surface 30a will exhibit a greater contact angle than would be observed on the top surface 30a prior to the application of the surface modification agent. The increased hydrophobicity at the top surface 30a will reduce the ability of water molecules to attach to and wet the top surface 30a, which operates to protect the top surface 30a against future moistening from the attachment of water molecules from the surrounding atmosphere. The dehydration of top surface 30a and the increase in the resistance to moistening of top surface 30a (i.e., an increase in the ability of top surface 30a to repel water arriving from the external environment surrounding the chip 12) may protect the metal pad 14 by reducing its susceptibility to pitting corrosion. In particular, the surface modification alleviates pitting corrosion initiated at the top surface 14a of the metal pad 14. Pitting corrosion may be prohibited or, alternatively, pitting corrosion may be reduced in comparison with the pitting corrosion experienced by the metal pad 14 in the absence of the surface modification.

The surface modification agent may be applied to the top surface 30a via liquid deposition (e.g., spin coating, spray coating, or puddling) or vapor deposition. The surface modification agent may be applied in a single application or in multiple individual applications. The wafer 10 may be at room temperature or may be heated to a temperature above room temperature. The duration of contacting the top surface 30a with the surface modification agent may vary according to the reactivity between the functional groups at the top surface 30a and the surface modification agent, as well as the reacting environment. The surface modification reaction may be conducted for a time period and at a temperature that are sufficient to achieve a targeted degree of surface modification and to release any residual surface modification agent. The chip 10 may be heated above room temperature to promote the reaction occurring at the top surface 30a. Alternatively, the reaction occurring at the top surface 30a to replace the functional group may be promoted using ultraviolet irradiation.

In one embodiment, the surface modification agent may be a silylation agent that promotes a silylation reaction at the top surface 30a that dehydrates the top surface 30a and that protects the top surface 30a against future moistening. If the surface layer 30 is comprised of a metal oxide presenting hydroxyl groups (OH) at the top surface 30a, the silylation reaction introduces silyl groups, such as trimethylsilyl groups comprised of three methyl groups bonded to a silicon atom (($CH_3)_3$Si), at the top surface 30a to replace the hydroxyl groups. The silylation reaction releases ammonia gas and may create an organic-like surface layer 30. Siloxyl groups are characterized by chemical inertness and a large molecular volume. The silylation agent may comprise, but is not limited to, hexamethyldisilazane (HMDS), which has a molecular formula of $C_6H_{19}NSi_2$. The silylation agent may be vaporized to form a vapor and caused to contact the top surface 30a, may be applied to the top surface 30a by spin coating, may be sprayed from a nozzle onto top surface 30a, or may be applied to top surface 30a in a different manner (e.g., by immersion or puddling).

In an embodiment, the entirety of the top surface 30a receives the surface modification promoted by the surface modification agent. Alternatively, only a portion of the top surface 30a may be surface modified or the surface modification may be discontinuous. If the metal pad 14 is a probe pad or operates in a dual-function probe/bond pad role, then the surface modification to the top surface 30a is present at the time of electrical testing unless the surface layer 30 is removed or the surface treatment is reversed. Even if the metal pad 14 is not used for electrical testing and is instead used exclusively for bonding with a chip carrier, the top surface 30a that participates in the bonding may be the recipient of the surface modification.

In one embodiment, the metal comprising the metal pad 14 is not modified by the action of the surface modification agent and the reaction is confined to the top surface 30a of the surface layer 30 on the metal pad 14. The surface modification agent is applied after the metal pad 14 is formed and prior to testing/storage/transportation of the chip 12 and/or wafer 10 to which the chip 12 integral. For example, the surface modification agent may be applied after back-end-of-line processing is complete and before the chip 12 is tested using a wafer probe. After the metal pad 14 is formed, additional lithography steps are absent from the process flow. For example, the dielectric passivation layer 25 may be present prior to surface modification by silylation. The surface modification to the top surface 30a persists after the reaction with the surface modification agent. The surface modification is not temporary in effect such that the top surface 30a remains chemically inert to the attachment of water molecules for an indefinite period of time following the surface treatment unless, or until, the surface modification to top surface 30a is reversed or the surface layer 30 is removed.

Figure 4:
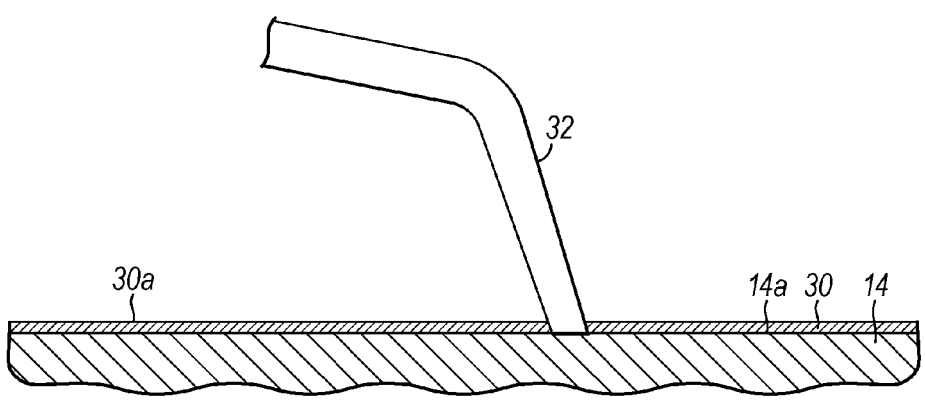
FIG. 4 is a side view of a probe being used to establish contact with the metal pad for chip testing.

With reference to FIG. 4 in which like reference numerals refer to like features in FIGS. 1, 2, the chip 12 may be tested without removing the surface layer 30 with the modified top surface 30a from the metal pad 14. In this instance, a probe 32 may penetrate through the surface layer 30 to reach the metal pad 14 and establish contact with the constituent metal to provide an electrical connection. The probe 32 may belong to a set of multiple probes on a probe card in which instance over-travel of the probe 32, after initial contact, may ensure that contact and electrical connection are established between all probes in the set and the material of the metal pad 14. The over-travel may cause the probe 32 to penetrate to a shallow depth beyond the plane of the top surface 14a of the metal pad 14 and/or may scrape and remove the surface layer 30 over any distance of lateral travel in the plane of the top surface 14a.

The probe 32 may be used in testing to assess the gross functionality of the chips 12 on the wafer 10. Each chip 12 is held in a testing orientation and engaged with a probe card to test the individual integrated circuits for functional defects by applying special test patterns to them according to a test program. The test patterns are communicated from the probe 32 to the metal pad 14, and then through the interconnect structure to the integrated circuit 15 (FIG. 2) on the chip 12.

Alternatively, prior to testing, all or part of the surface layer 30 may be removed by, for example, an oxygen plasma or ozone ash. Alternatively, prior to testing, the modification made to the surface layer 30 at the top surface 30a may be reversed to restore the top surface 30a to an unmodified state and thereby decrease the hydrophobicity. For example, if the top surface 30a has been silylated, a desilylation reaction may be performed to exchange the silyl group for a proton. The desilylation reaction may utilize a halide plasma, such as a fluorine plasma, or exposure to hydrofluoric acid acting as a strong hydrogen bond acceptor. A liquid, such as iodine monochloride (ICl) or bromine that are liquid near room temperature, may be used, as well as photochemical desilylation techniques or a fluoride salt.

With reference to FIG. 5 in which like reference numerals refer to like features in FIGS. 1, 2, the chip 12 with the metal pad 14 and the surface layer 30 with the modified top surface 30a, and other similar chips, may be separated from the wafer 10 via a dicing or sawing process and placed into a holder 34 configured to transport, handle, and store the chip 12. In a representative embodiment, the holder 34 may comprise a plastic tray with an array of cavities each dimensioned to match the die size and a lid that attaches to the plastic tray to close the container (i.e., a waffle tray or a Jedec tray). The holder 34 defines an outer shell that protects the chip 12 against damage and/or contamination during transportation, handling, and storage between fabrication (including the surface modification) and the time of delivery to a customer or other end user and/or end use. The assembly of chip 12 and holder 34 is temporary and may only persist for the time period of transportation, handling, and storage. The chips 12 may need to be transported, for example, en route for delivery to a customer or other end user. Alternatively, the individual chips 12 may be transported, held, and stored in a gel pack.

With reference to FIG. 6 in which like reference numerals refer to like features in FIGS. 1, 2, the entire wafer 10 including the chip 12 with the metal pad 14 and the surface layer 30 with the modified top surface 30a may be temporarily assembled with a holder 36 that is configured to transport, handle, and store the wafer 10. For example, the holder 36 may comprise a lidded wafer carrier box that is not automation compatible. The wafer 10 may also include the optional metal pads 16. The holder 36 defines an outer shell that protects the wafer 10 and the chips 12 on the wafer 10 against damage and/or contamination during transportation, handling, and storage between fabrication (including the surface modification) and the time of delivery to a customer or other end user and/or end use. The assembly of wafer 10 and holder 34 is temporary and may only persist for the period of transportation, handling, and storage. Alternatively, the wafer 10, either before or after testing, may be placed into a wafer cassette that can be inserted into various machines, such as automated test equipment or a wafer prober, for automatic handling. As the wafer 10 is intact, the wafer 10 may still include the metal pads 16 that have been treated with the surface modification agent.

With reference to FIG. 7 in which like reference numerals refer to like features in FIGS. 1, 2, the chip 12 with the metal pad 14 and the surface layer 30 with the modified top surface 30a may be mounted in a chip carrier 38 as packaging for surface mounting. An internal cavity may be provided for positioning the chip 12 within the chip carrier 38. An electrical connection is established between the metal pad 14 and a corresponding structure on the chip carrier 38. A lead, which may have the representative form of a wire 40 for a wirebonding process, may be provided to electrically connect the metal pad 14 with a corresponding metal pad 42 on the chip carrier 38. The electrical connection between each metal pad 14 on the chip 12 and the corresponding metal pad 42 on the chip carrier 38 may be accomplished in a different manner, such as with solder bumps in flip chip bonding. Some or all of the metal pads 14 participating in the electrical connections may be configured to serve as both probe and bond pads, or some of the metal pads 14 may operate exclusively as probe pads and not participate in the wirebonding process.

The chip 12 and chip carrier 38 may be encapsulated in a molded outer package comprised of a polymer resin. The chip carrier may be comprised of a ceramic, a metal or an organic material. The chip carrier 38 may be configured with electrical connections used to further couple the chip carrier 38 with a circuit board.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. The chip may be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for processing a chip having a first metal pad in the chip region and a second metal pad in the kerf region, the method comprising:
   silylating a metal oxide comprising a surface layer on the first metal pad and on the second metal pad by replacing hydroxyl groups at binding sites over at least a portion of a top surface of the surface layer with siloxyl groups so as to increase hydrophobicity and decrease pitting corrosion;
   after the metal oxide is silyated, removing the surface layer from the first metal pad;
   after the surface layer is removed from the first metal pad, contacting the first metal pad with a probe of a wafer prober;
   testing the chip for a functional defect with a test signal communicated from the probe to the first metal pad; and
   after the chip is tested for the functional defect, installing the chip in an end product with the surface layer on the second metal pad.

2. The method of claim 1 wherein the surface modification agent comprises hexamethyldisilazane.

3. The method of claim 1 further comprising:
   placing the chip into a holder configured to deliver the chip to an end user,
   wherein the end user installs the chip in the end product.

4. The method of claim 1 wherein the chip is an integral portion of a wafer, and further comprising:
   placing the wafer into a holder configured to deliver the wafer to an end user
   wherein the end user installs the chip in the end product.

5. The method of claim 1 further comprising:
   mounting the chip to a chip carrier.

6. The method of claim 5 further comprising:
   establishing an electrical connection between the second metal pad on the chip and a metal pad on the chip carrier.

7. The method of claim 1 wherein removing the surface layer from the first metal pad comprises:
   performing a desilylation reaction to exchange the silyl groups for protons.

8. The method of claim 1 further comprising:
   forming the first metal pad and the second metal pad,
   wherein lithography steps are absent after the first metal pad and the second metal pad are formed.

* * * * *